United States Patent
Suda

(10) Patent No.: US 9,733,571 B2
(45) Date of Patent: Aug. 15, 2017

(54) ILLUMINATION OPTICAL DEVICE, EXPOSURE APPARATUS, AND METHOD OF MANUFACTURING ARTICLE

(71) Applicant: CANON KABUSHIKI KAISHA, Tokyo (JP)

(72) Inventor: Hiromi Suda, Utsunomiya (JP)

(73) Assignee: CANON KABUSHIKI KAISHA, Tokyo (JP)

( * ) Notice: Subject to any disclaimer, the term of this patent is extended or adjusted under 35 U.S.C. 154(b) by 0 days.

(21) Appl. No.: 14/847,058

(22) Filed: Sep. 8, 2015

(65) Prior Publication Data
US 2016/0085158 A1    Mar. 24, 2016

(30) Foreign Application Priority Data
Sep. 22, 2014 (JP) ................... 2014-192436

(51) Int. Cl.
*G03B 27/52*     (2006.01)
*G03B 27/42*     (2006.01)
*G03F 7/20*     (2006.01)

(52) U.S. Cl.
CPC ................... *G03F 7/70075* (2013.01)

(58) Field of Classification Search
CPC ............. G03F 7/70058; G03F 7/70075; G03F 7/2004; G03F 7/70175; G03F 7/70191; G03F 7/70641; G03F 9/70; G03F 7/2008; G03F 7/70; G03F 7/70083; G03F 7/70108; G02B 19/0047
See application file for complete search history.

(56) References Cited

U.S. PATENT DOCUMENTS

| | | | |
|---|---|---|---|
| 4,198,583 A | | 4/1980 | Anderson et al. |
| 4,918,583 A | * | 4/1990 | Kudo ............ G02B 3/005 |
| | | | 359/619 |

(Continued)

FOREIGN PATENT DOCUMENTS

| | | | |
|---|---|---|---|
| JP | 03202149 A | * | 9/1991 |
| JP | H03-202148 A | | 9/1991 |

(Continued)

OTHER PUBLICATIONS jp 03202149 A.*

(Continued)

*Primary Examiner* — Mesfin Asfaw
(74) *Attorney, Agent, or Firm* — Rossi, Kimms & McDowell LLP

(57) ABSTRACT

An illumination optical device for illuminating a plane to be illuminated using light from a light source, includes: an optical integrator configured to cause an optical intensity distribution to be uniform on an emission end surface by reflecting light incident from an incident end surface in an inside surface a plurality of times; and a light flux forming unit configured to convert a light flux from a focal position where a condensing mirror condenses light from the light source at a first angle with respect to an optical axis directed from the light source to the plane to be illuminated to a light flux to be incident on the incident end surface of the optical integrator at a second angle greater than the first angle with respect to the optical axis, wherein the plane to be illuminated is illuminated with light from the optical integrator.

31 Claims, 4 Drawing Sheets

(56) References Cited

U.S. PATENT DOCUMENTS

| | | | |
|---|---|---|---|
| 5,646,715 A | 7/1997 | Wangler | |
| 6,249,382 B1 | 6/2001 | Komatsuda | |
| 7,092,071 B2 | 8/2006 | Shinoda | |
| 7,630,136 B2 | 12/2009 | Ryzhikov et al. | |
| 2002/0008862 A1* | 1/2002 | Kobayashi | G03F 7/70258 355/53 |
| 2006/0072335 A1* | 4/2006 | Seward | G02B 21/125 362/551 |

FOREIGN PATENT DOCUMENTS

| | | | |
|---|---|---|---|
| JP | 7201730 A | 8/1995 | |
| JP | 2000021765 A | 1/2000 | |
| JP | 2000162707 A | 6/2000 | |
| JP | 2002139844 A | 5/2002 | |
| JP | 2003243276 A | 8/2003 | |
| JP | 2005116831 A | 4/2005 | |
| JP | 2008047887 A | 2/2008 | |

OTHER PUBLICATIONS

Office Action issued in Japanese Application No. JP2014192436, mailed Jun. 28, 2016. English translation provided.
Office Action issued in Taiwanese Patent Application No. 104127332, mailed Nov. 7, 2016. English translation provided.
Office Action issued in Chinese Appln. No. 201510591980.1 mailed Mar. 13, 2017. English translation provided.

* cited by examiner

ILLUMINATION OPTICAL DEVICE, EXPOSURE APPARATUS, AND METHOD OF MANUFACTURING ARTICLE

BACKGROUND OF THE INVENTION

Field of the Invention

The present invention relates to an illumination optical device, an exposure apparatus, and a method of manufacturing an article.

Description of the Related Art

In lithography processes included in processes of manufacturing semiconductor devices or the like, exposure apparatuses that transfer patterns formed in originals (for example, reticles) onto substrates (for example, wafers in which resist layers are formed on the surfaces) via projection optical systems or the like are used. The exposure apparatuses include illumination optical devices that illuminate the originals with light fluxes from light sources. Here, when illumination of the originals by the illumination optical devices is not uniform, transferring of patterns to resists is not sufficient, and thus the exposure apparatuses may not provide devices with high quality. Further, when the illumination optical devices are unable to illuminate the originals with high illuminance, throughputs of all of the exposure apparatuses are affected. Accordingly, the illumination optical devices are required to illuminate the originals with substantially uniform illuminance. Accordingly, in illumination optical devices of the related art, uniformity of illuminance is improved by disposing optical members such as reflection type optical integrators between light sources and planes of illumination. Japanese Patent Application No. 7-201730 discloses an illumination unit improving uniformity of illuminance of a plane of illumination by adopting an optical rod (glass rod) as a reflection optical integrator and disposing an emission end surface of the optical rod at a conjugated position with the surface of an original. In the illumination unit, an angle of a light flux incident on the optical rod is varied by driving an optical system provided on a front stage side of the optical integrator.

In general, in order to cause an illuminance distribution on the emission end surface of the optical rod to be uniform, the cross-sectional shape of the optical rod is required to be polygonal so that the number of internal reflections of the incident light is sufficiently large. That is, the cross-sectional area of the cross-sectional surface vertical to the optical axis of the optical rod is required to be small or the optical rod is required to be long in an optical axis direction. However, when the cross-sectional area of the optical rod is small, a ratio of light straying from the incident end surface of the optical rod at the time of deviation of the position of the light incident on the optical rod increases. This means that a loss of the amount of light from a light source easily increases, which is not preferable. On the other hand, when the length of the optical rod is long, a loss of the amount of light inside the optical rod (a loss dependent on glass material transmittance in the case of a glass rod or a loss dependent on reflection efficiency of a reflection surface in the case of a hollow rod) may increase and the size of the optical illumination optical device may increase, which is not preferable. In particular, in the technology disclosed in Japanese Patent Application No. 7-201730, an optical rod with a length of about 500 mm in the optical axis direction is used. Thus, when such a long optical rod is used, there is a concern of the illuminance of the plane of illumination deteriorating or the size of the entire illumination optical device increasing.

SUMMARY OF THE INVENTION

The present invention provides an illumination optical device advantageous to high illuminance of a plane of illumination and uniform illumination without an increase in size.

According to an aspect of the present invention, there is provided an illumination optical device illuminating a plane to be illuminated using light from a light source. The illumination optical device includes: an optical integrator configured to cause an optical intensity distribution to be uniform on an emission end surface by reflecting light incident from an incident end surface in an inside surface a plurality of times; and a light flux forming unit configured to convert a light flux from a focal position where a condensing mirror condenses light from the light source at a first angle with respect to an optical axis directed from the light source to the plane to be illuminated to a light flux to be incident on the incident end surface of the optical integrator at a second angle greater than the first angle with respect to the optical axis. The plane to be illuminated is illuminated with light from the optical integrator.

Further features of the present invention will become apparent from the following description of exemplary embodiments (with reference to the attached drawings).

DESCRIPTION OF THE EMBODIMENTS

Hereinafter, embodiments of the present invention will be described with reference to the drawings.

First Embodiment

Figure 1:
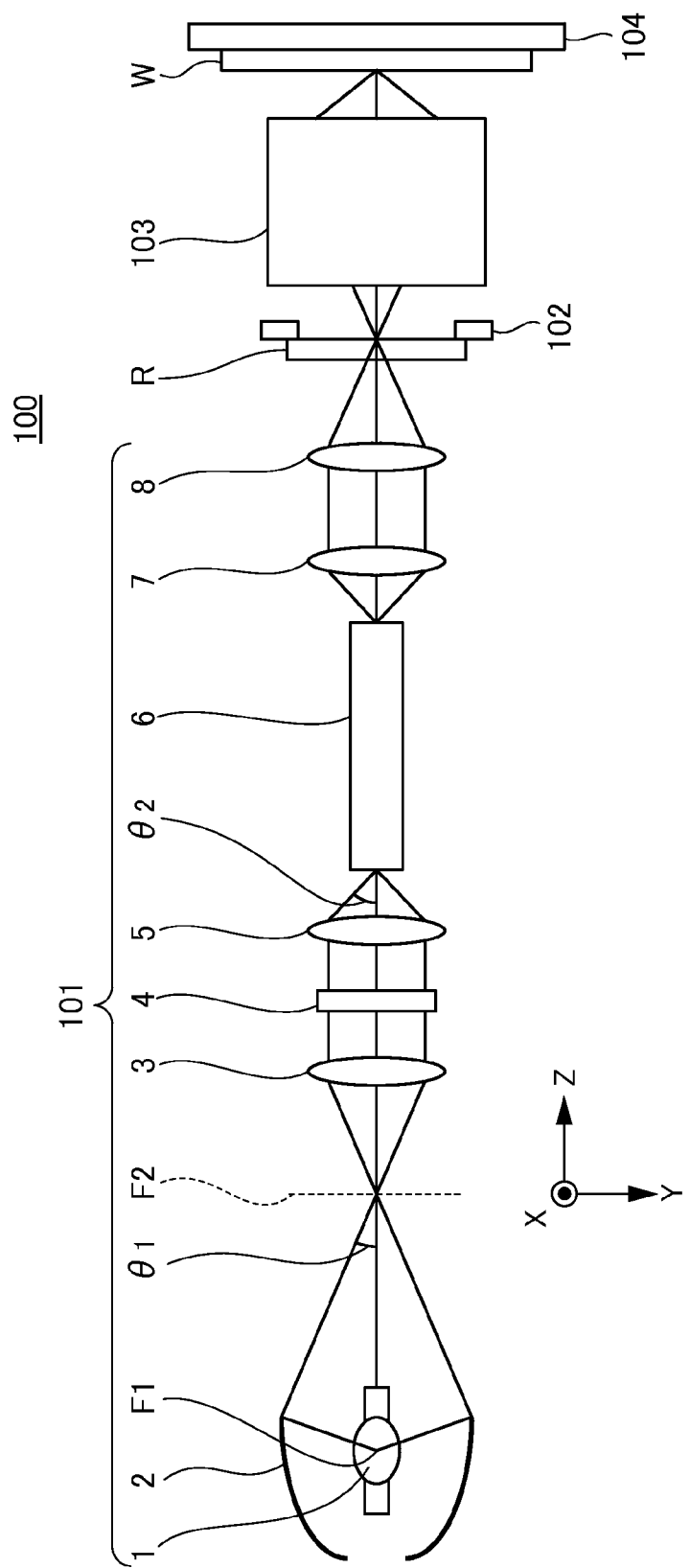
FIG. 1 is a diagram illustrating the configuration of an illumination optical device according to a first embodiment of the present invention.

First, an illumination optical device and an exposure apparatus including the illumination optical device according to the first embodiment of the present invention will be described. FIG. 1 is a schematic diagram illustrating the configuration of an exposure apparatus 100 and an illumination optical device 101 included in the exposure apparatus 100 according to the embodiment. The exposure apparatus 100 is, for example, a projection type exposure apparatus that is used for a lithography process in a process of manufacturing a semiconductor device and exposes (transfers) an image of a pattern formed in a reticle R to a wafer W (substrate) in a scanning exposure scheme. In each drawing after FIG. 1, the Z axis is oriented in the normal direction of the wafer W and the X and Y axes are oriented in directions perpendicular to a plane parallel to the surface of the wafer W. The exposure apparatus 100 includes the illumination optical device 101, a reticle stage 102, a projection optical system 103, and a wafer stage 104.

The illumination optical device 101 illuminates the reticle R which is a plane of illumination (plane to be illuminated) by adjusting light (light flux) from a light source 1. As the light source 1, for example, an extra-high pressure mercury lamp supplying light such as an i beam (with a wavelength of 365 nm) can be adopted. However, the light source 1 is not limited thereto. For example, a KrF excimer laser supplying light with a wavelength of 248 nm, an ArF excimer laser supplying light with a wavelength of 193 nm, or an F2 laser supplying light with a wavelength of 157 nm may be adopted. When the illumination optical device 101 and the projection optical system 103 are configured to include a reflection refraction system or a reflection system, a charged particle beam such as an X beam or an electron beam can also be adopted. The details of the illumination optical device 101 will be described below. The reticle R is an original which is formed of, for example, quartz glass and in which a pattern (for example, a circuit pattern) to be transferred to the wafer W is formed. The reticle stage 102 holds the reticle R and is movable in each of the X axis direction and the Y axis direction. The projection optical system 103 projects light passing through the reticle R to the wafer W at a predetermined magnification (for example, ½). The wafer W is a substrate which is formed of monocrystalline silicon and in which a resist (photosensitive material) is applied to the surface. For example, the wafer stage 104 holds the wafer W via a wafer chuck (not illustrated) and is movable in each axis direction of X, Y, and Z axes (including ωx, ωy, and ωz which are rotational directions in some cases).

Next, the configuration of the illumination optical device 101 will be described specifically. The illumination optical device 101 includes an elliptical mirror 2, a first relay lens 3, a wavelength filter 4, a second relay lens 5, an optical integrator 6, a first condenser lens 7, and a second condenser lens 8 in this order from the light source 1 to the plane of illumination. The elliptical mirror (condensing mirror) 2 condenses the light (light flux) radiated from the light source 1 on a second focal position F2. On the other hand, the light source 1 is disposed at a first focal position F1 of the elliptical mirror 2. The first relay lens 3 and the second relay lens 5 are imaging optical systems which are light flux forming units according to the embodiment. The second focal position F2 on a predetermined plane on the front stage side and an incident end surface of the optical integrator 6 on the rear stage side have a conjugated relation. The wavelength filter 4 blocks light in a specific wavelength region and can regulate (select) an exposure wavelength when the exposure apparatus 100 is adopted.

The optical integrator 6 is an internal reflection type optical member that causes an optical intensity distribution on an emission end surface to be uniform by reflecting the light flux incident from the incident end surface in an internal surface a plurality of times. In the embodiment, the optical integrator 6 is assumed to be an optical rod of which the entire shape is a square pillar and a cross-sectional shape is square. The optical integrator 6 is not limited to the optical rod. For example, a hollow rod of which an inside portion forms a reflection surface may be used as long as the hollow rod performs the same operation. The shapes of the incident end surface and the emission end surface (both of which are an XY plane) of the optical integrator 6 are not limited to squares and other polygons may be used. When light is incident on the optical integrator 6, the emission end surface is uniformly illuminated through an operation of internal reflection.

The first condenser lens (main illumination lens front group) 7 and the second condenser lens (main illumination lens rear group) 8 pass the light emitted from the emission end surface of the optical integrator 6 to illuminate the reticle R. The first condenser lens 7 and the second condenser lens 8 are imaging optical systems and form the light from the optical integrator as an image on the plane of illumination. The emission end surface of the optical integrator 6 is disposed at a front side focal position of the first condenser lens 7. The emission end surface is optically conjugated with the reticle R. More precisely, a conjugated position is slightly shifted to prevent a foreign substance on the emission end surface of the optical integrator 6 from being transferred. Here, the shape of an illumination region illuminating the reticle R is rectangular, but another shape may also be used. Thereafter, the light emitted from the reticle R, that is, a pattern image, is transferred to the wafer W via the projection optical system 103.

In the embodiment, the illumination optical device 101 includes the relay lens 3 and 5 that adjust the shape (specifically, an angle of incidence of the light flux) of the light flux directed to the incident end surface of the optical integrator 6, as described above. Thus, the number of internal reflections in the optical integrator 6 can be increased while the length of the optical integrator 6 in the optical axis direction (the Z axis direction) is maintained without the decrease in the cross-sectional area of the incident end surface (XY plane) of the optical integrator 6. Hereinafter, this principle will be described.

A refractive index of the optical integrator 6 is assumed to be n, a distance between facing reflection surfaces with a square cross-sectional surface is assumed to be d (mm), and the length of the optical integrator 6 is assumed to be L (mm). An angle (first angle) of the light flux condensed at the second focal position F2 is assumed to be $\theta_1$ (deg) and an angle (second angle) of the light flux condensed on the incident end surface of the optical integrator 6 is $\theta_2$ (deg). An imaging magnification from the second focal position F2 and the incident end surface of the optical integrator 6 is assumed to be β. At this time, the length L necessary to perform the internal reflection of the light flux incident on the optical integrator 6 N times is expressed by Expression (1). The first angle $\theta_1$ and the second angle $\theta_2$ satisfy a relation expressed in Expression (2).

[Math 1]

$$L = N \times \frac{d}{\tan\left\{\sin^{-1}\left(\frac{\sin\theta_2}{n}\right)\right\}} \quad (1)$$

[Math 2]

$$\sin\theta_2 = \frac{\sin\theta_1}{\beta} \quad (2)$$

Here, the distance d is decided based on a design condition such as sensitivity to a loss of the amount of light on the incident end surface of the optical integrator 6. The length L is decided based on a design condition such as restriction on the loss of the amount of the light inside the optical integrator 6 or restriction on the space of the illumination optical device 101. Accordingly, in order to increase the number of internal reflections in the optical integrator 6 while preventing the illuminance of the plane of illumination from deteriorating, it is effective to set the imaging magnification β by the relay lenses 3 and 5 to be less than 1 and satisfy a relation of $\sin \theta_2 > \sin \theta_1$. The relation of $\sin \theta_2 > \sin \theta_1$ is a relation in which the second angle $\theta_2$ is greater than the first angle $\theta_1$.

Hereinafter, numerical values will be applied specifically for description. In order to obtain target illuminance uniformity on the emission end surface of the optical integrator 6, the number of internal reflections N=3 or more is necessary. When the optical integrator 6 in which n=1.5, d=30 mm, and L=300 mm is used, β may be set to be equal to or less than about 0.8 from Expression (1) and Expression (2). As a reference, for example, when the imaging magnification of the first relay lens 3 is equal to the imaging magnification of the second relay lens 5, β=1 is satisfied. Thus, a rod in which L=379.7 mm is necessary. In this case, when internal transmittance of a glass material of which the optical integrator 6 is formed is set to 99.5%/cm, a loss of the amount of light increases by about 4% compared to the case of L=300 mm. When the loss of the amount of light increases, the throughput of the exposure apparatus in which the illumination optical device is adopted deteriorates.

The decrease in the imaging magnification β means that light is concentrated on a specific region by the decrease. Therefore, light power on the incident end surface of the optical integrator 6 may increase, and thus there is a possibility of durability of the optical integrator 6 being affected. Accordingly, in the embodiment, the light power is restricted by narrowing the wavelength band of the light emitted from the light source by using the wavelength filter 4. Hereinafter, the principle will be described.

Figure 2:
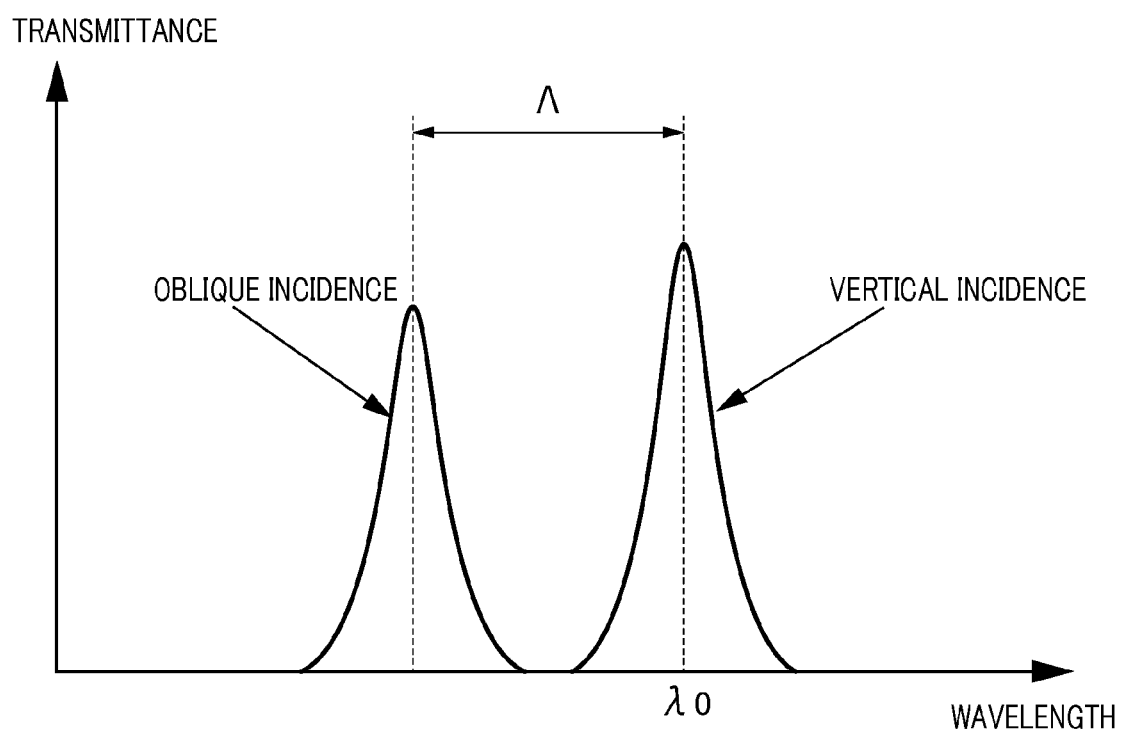
FIG. 2 is a graph illustrating transmittance characteristics of a wavelength filter.

In general, the wavelength filter is a filter in which a dielectric multilayer is formed in a parallel plate, and a transmission wavelength is changed by an incident angle of the light. FIG. 2 is a graph illustrating transmittance characteristics of a bandpass filter when a transmission wavelength is decided. FIG. 2 illustrates a wavelength of peak transmittance as a central wavelength $\lambda_0$ and illustrates a relation between an incident angle and a transmission wavelength of light vertically incident and light obliquely incident on the dielectric multilayer. As understood from FIG. 2, maximum transmittance of the obliquely incident light is lower than that of the vertically incident light. When the incident angle of the light is changed, a difference in a light path length decreases in the dielectric multilayer, and thus the central wavelength is shifted to a short wavelength side. Further, light in which an angle distribution does not spread should be incident on the wavelength filter. For example, a wavelength region (specifically, also including the lower part of the transmittance distribution) indicated by Λ in FIG. 2 is permeated and becomes a distribution including many wavelengths other than a desired wavelength. Accordingly, it is not realistic to distribute a wavelength filter at a position (place) at which a light angle distribution spreads as in the incident end surface of the optical integrator 6. The position at which the light angle distribution does not spread means a place in which a position distribution spreads from a Helmholtz-Lagrange invariant. That is, a position at which a beam effective diameter is larger than the incident end surface of the optical integrator 6 is preferable as a position at which the wavelength filter is disposed. Accordingly, in the embodiment, the wavelength filter 4 is disposed near a pupil plane in which the position distribution spreads in the imaging optical system including the first relay lens 3 and the second relay lens 5. Thus, it is possible to suppress the influence on the durability of the optical integrator 6, which is caused due to a decrease in the magnification of the imaging optical system including the first relay lens 3 and the second relay lens 5.

In this way, in the illumination optical device 101, the number of internal reflections in the optical integrator 6 can be increased while the length of the optical integrator 6 in the optical axis direction is maintained without the decrease in the cross-sectional area of the incident end surface of the optical integrator 6. Thus, the deterioration in the illuminance of the plane of illumination is suppressed and the uniformity of the illuminance can be improved without the increase in the entire configuration of the illumination optical device 101.

In the embodiment, as described above, it is possible to provide the illumination optical device advantageous to the high illuminance of the plane of illumination and the uniform illumination without an increase in its size. In the exposure apparatus including the illumination optical device, it is possible to realize pattern transfer with higher precision while it is advantageous to ensure an internal space.

Second Embodiment

Figure 3:
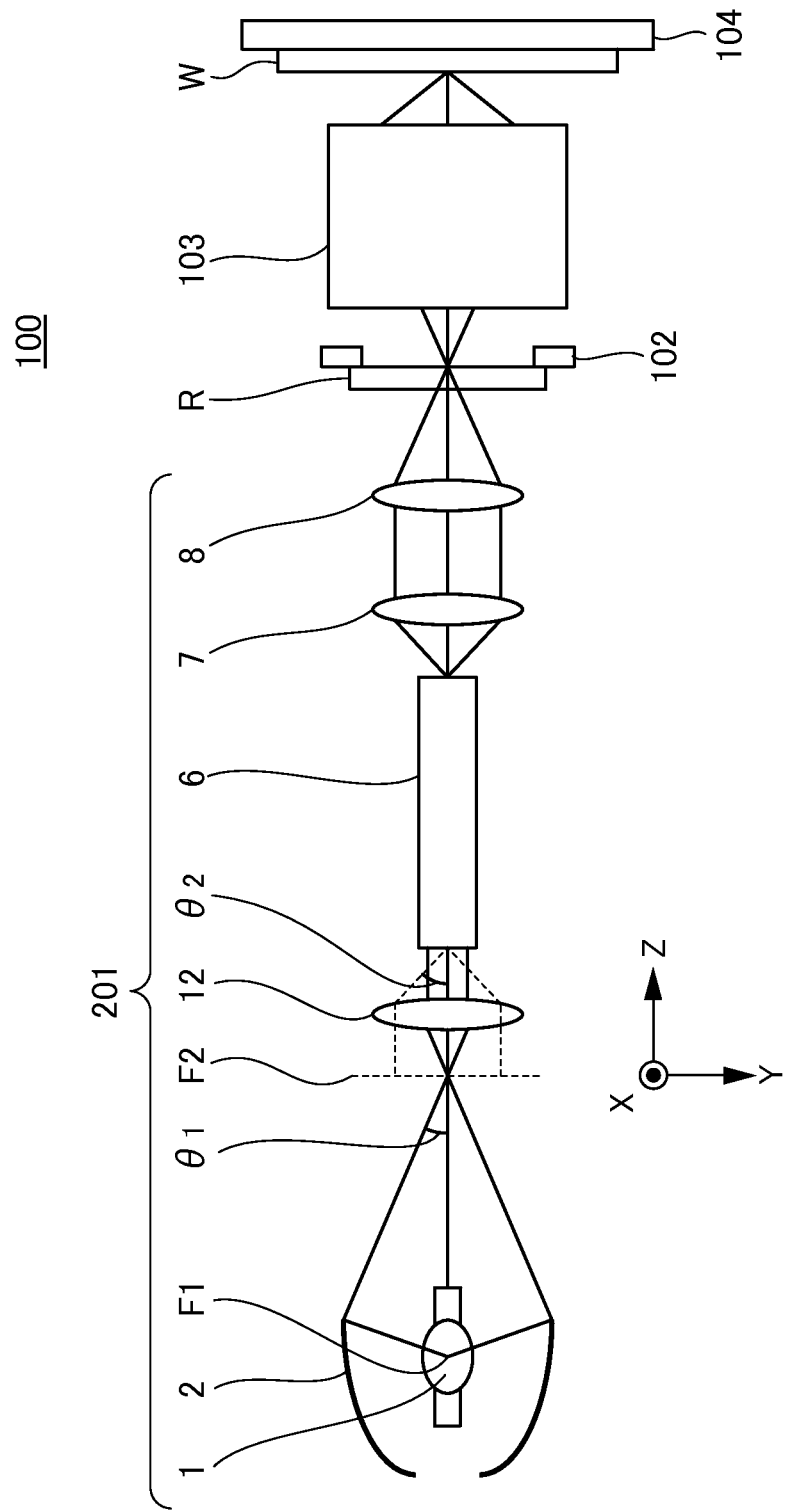
FIG. 3 is a diagram illustrating the configuration of an illumination optical device according to a second embodiment of the present invention.
Figure 4:
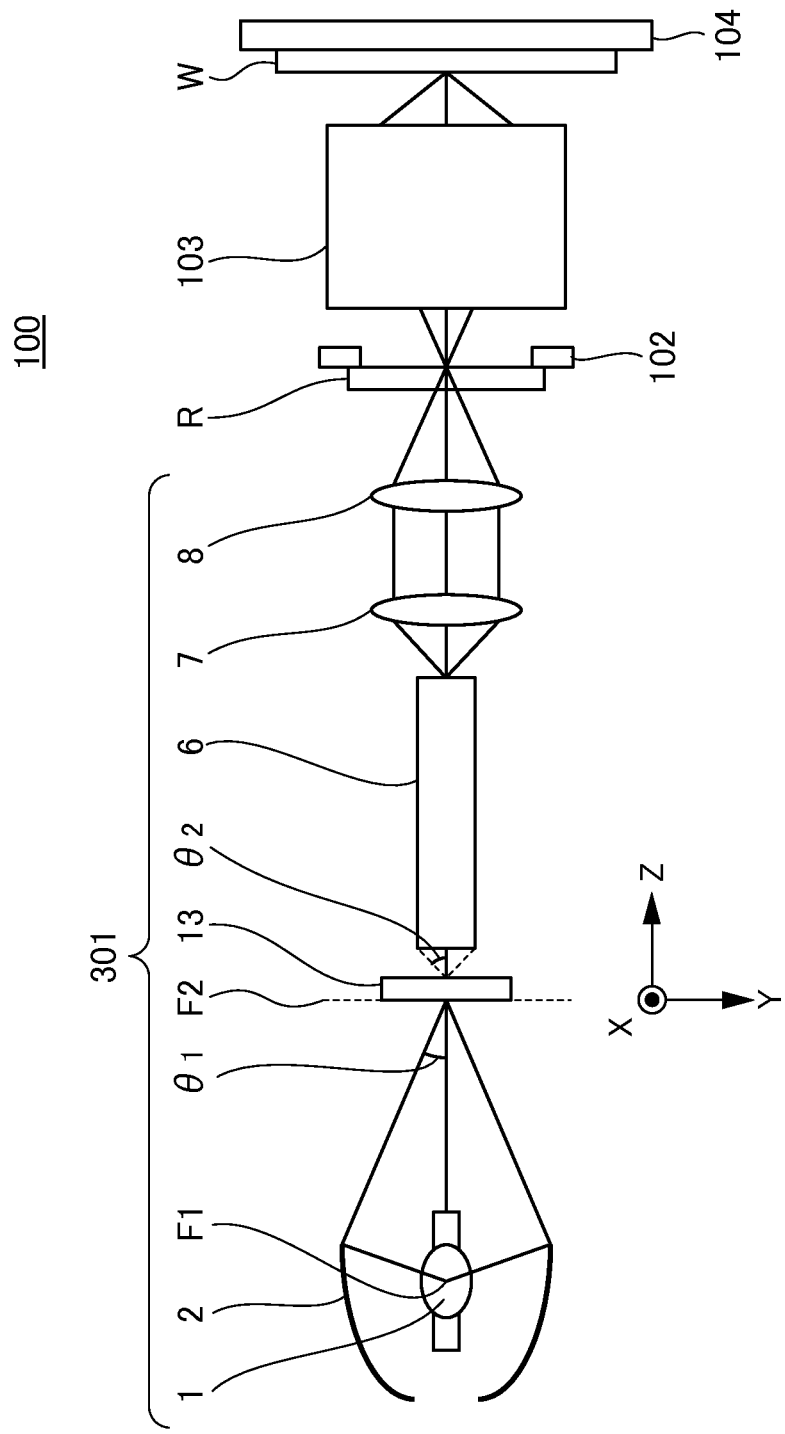
FIG. 4 is a diagram illustrating the configuration of an illumination optical device according to a third embodiment of the present invention.

Next, an illumination optical device according to a second embodiment of the present invention will be described. FIG. 3 is a schematic diagram illustrating the configuration of an illumination optical device 201 according to the embodiment. The same reference numerals are given to the same constituent elements as those of the illumination optical device 101 according to the first embodiment, and the description thereof will be omitted. The characteristics of the illumination optical device 201 are that a condenser lens 12 is disposed as a light flux forming unit according to the embodiment on the rear end side of the wavelength filter 4 (not illustrated) instead of the first relay lens 3 and the second relay lens 5 adopted in the first embodiment. In this case, light condensed at the second focal position F2 is transmitted sequentially through the wavelength filter 4 and the condenser lens 12, and then is incident on the optical integrator 6. The condenser lens 12 is a Fourier transform lens serving as a condensing optical system. The second focal position F2 on a predetermined plane and the incident end surface of the optical integrator 6 has a relation of a Fourier transform. When a light flux diameter of the second focal position F2 is assumed to be D and a focal distance of the condenser lens 12 is assumed to be f, Expression (3) is established.

[Math 3]

$$\sin \theta_2 = D/f \quad (3)$$

Here, the light flux diameter D is decided based on design conditions of the light source 1 and the elliptical mirror 2. Accordingly, in order to increase the number of internal reflections in the optical integrator 6, it is effective to decrease the focal distance f of the condenser lens 12 and satisfy a relation of $\sin \theta_2 > \sin \theta_1$ from Expression (1) and Expression (3). Even in the illumination optical device 201 with such a configuration, the same advantages as in the first embodiment can be obtained.

Third Embodiment

Next, an illumination optical device according to a third embodiment of the present invention will be described. FIG.

4 is a schematic diagram illustrating the configuration of an illumination optical device 301 according to the embodiment. The same reference numerals are given to the same constituent elements as those of the illumination optical device 101 according to the first embodiment, and the description thereof will be omitted. The characteristics of the illumination optical device 301 are that a diffusion member 13 is disposed as a light flux forming unit according to the embodiment on the rear end side of the wavelength filter 4 (not illustrated) instead of the first relay lens 3 and the second relay lens 5 adopted in the first embodiment. In this case, light condensed at the second focal position F2 is transmitted sequentially through the wavelength filter 4 and the diffusion member 13, and then is incident on the optical integrator 6. The diffusion member 13 is a diffusion plate or a transmission type diffraction optical element diverging incident light (incident light flux) at a predetermined divergence angle $\theta_2$. When the diffusion member 13 is used, in order to increase the number of internal reflections in the optical integrator 6, it is effective to increase the divergence angle $\theta_2$ by the diffusion member 13 and satisfy a relation of $\sin \theta_2 > \sin \theta_1$. Even in the illumination optical device 301 with such a configuration, the same advantages as in the first embodiment can be obtained. A divergence angle distribution to the optical integrator 6 is an illumination coherency $\sigma$ (a $\sigma$ value=a numerical aperture on the emission side of the illumination optical device 301/a numerical aperture on the incident side of the projection optical system 103) of the illumination optical device 301. Therefore, in a far-field region of the diffusion member 13, a distribution in the XY plane is preferably a substantially circular pattern. In the illumination optical device 301, not only the diffusion member 13 but also the imaging optical system or the Fourier transform lens exemplified in the foregoing first and second embodiments may be combined and disposed to be used between the second focal position F2 and the optical integrator 6.

In each of the foregoing embodiments, the number of constituent elements such as the relay lens, the condenser lens, and the diffusion member and the disposition positions thereof are merely examples and are not limited to the numbers and positions exemplified in each embodiment, as long as the various above-described conditions are satisfied.

(Article Manufacturing Method)

A method of manufacturing an article according to an embodiment of the present invention is suitable for manufacturing an article such as a microdevice (for example, a semiconductor device) or an element having a microstructure. This manufacturing method can include a step of forming a latent image pattern on a photosensitive agent of a substrate onto which the photosensitive agent is applied by using the above-described drawing apparatus (drawing step on the substrate), and a step of developing the substrate on which the latent image pattern is formed. Further, this manufacturing method includes other well-known steps (for example, oxidization, deposition, vapor deposition, doping, planarization, etching, resist removal, dicing, bonding, packaging and the like). The method of manufacturing an article according to the embodiment is superior to a conventional method in at least one of the performance, quality, productivity, and production cost of the article.

While the present invention has been described with reference to exemplary embodiments, it is to be understood that the invention is not limited to the disclosed exemplary embodiments. The scope of the following claims is to be accorded the broadest interpretation so as to encompass all such modifications and equivalent structures and functions.

This application claims the benefit of Japanese Patent Application No. 2014-192436 filed Sep. 22, 2014, which is hereby incorporated by reference herein in its entirety.

What is claimed is:

1. An illumination optical device for illuminating a first plane to be illuminated using light from a light source, the illumination optical device comprising:
one optical integrator; and
an imaging optical system configured to:
cause a second plane including a focal point where a condensing mirror condenses light from the light source at a first angle with respect to an optical axis directed from the light source to the first plane to be illuminated and an incident end surface of the one optical integrator to have an optically conjugated relation; and
convert light from the focal point to light to be incident on the incident end surface of the one optical integrator at a second angle greater than the first angle with respect to the optical axis,
wherein the one optical integrator reflects light incident from the incident end surface in an inside surface a plurality of times and emits light incident from the incident end surface, and
wherein the first plane to be illuminated is illuminated with light from the one optical integrator.

2. The illumination optical device according to claim 1, further comprising:
another imaging optical system configured to image light from the optical integrator on the first plane to be illuminated.

3. The illumination optical device according to claim 1, wherein an emission end surface of the optical integrator and the first plane to be illuminated are optically conjugated.

4. The illumination optical device according to claim 1, further comprising:
a wavelength filter configured to reduce light in a specific wavelength, and
wherein the wavelength filter is disposed between the focal point and the one optical integrator.

5. The illumination optical device according to claim 4, wherein the wavelength filter is disposed at a position at which a beam effective diameter is greater than that of the incident end surface of the one optical integrator.

6. The illumination optical device according to claim 4, wherein the wavelength filter is disposed closer to the light source than a lens of a plurality of lenses included in the imaging optical system closest to the one optical integrator in an optical path.

7. The illumination optical device according to claim 6, wherein the wavelength filter is disposed between the plurality of lenses included in the imaging optical system.

8. The illumination optical device according to claim 6, wherein the wavelength filter is disposed at a pupil plane of the imaging optical system or a vicinity of the pupil plane.

9. The illumination optical device according to claim 1, further comprising:
a wavelength filter configured to reduce light in a specific wavelength range, and
wherein the wavelength filter is disposed between the focal point and the one optical integrator.

10. The illumination optical device according to claim 9, wherein the wavelength filter is disposed closer to the light source than a lens of a plurality of lenses included in the condensing optical system closest to the one optical integrator in an optical path.

11. The illumination optical device according to claim 1, further comprising an imaging optical system configured to image light from the optical integrator on the first plane to be illuminated.

12. The illumination optical device according to claim 1, wherein the emission end surface of the optical integrator and the first plane to be illuminated are optically conjugated.

13. An illumination optical device for illuminating a first plane to be illuminated using light from a light source, the illumination optical device comprising:
   one optical integrator; and
   a condensing optical system configured to:
      cause a second plane including a focal point where a condensing mirror condenses light from the light source at a first angle with respect to an optical axis directed from the light source to the first plane to be illuminated and an incident end surface of the one optical integrator to optically have a Fourier transform relation; and
      convert light from the focal point to light to be incident on the incident end surface of the one optical integrator at a second angle greater than the first angle with respect to the optical axis,
   wherein the one optical integrator reflects light incident from the incident end surface in an inside surface a plurality of times and emits light incident from the incident end surface, and
   wherein the first plane to be illuminated is illuminated with light from the one optical integrator.

14. An exposure apparatus for transferring an image of a pattern form in an original onto a substrate, the exposure apparatus comprising:
   the illumination optical device according to claim 13; and
   a projection optical system configured to project a pattern of the original illuminated by the illumination optical device on the substrate,
   wherein the illumination optical device illuminates a third plane to be illuminated of the original.

15. An exposure apparatus for transferring an image of a pattern form in an original onto a substrate, the exposure apparatus comprising:
   an illumination optical device for illuminating a first plane to be illuminated of the original using light from a light source; and
   a projection optical system configured to project a pattern of the original illuminated by the illumination optical device on the substrate,
   wherein the illumination optical device comprises:
      one optical integrator; and
      an imaging optical system configured to:
         cause a second plane including a focal point where a condensing mirror condenses light from the light source at a first angle with respect to an optical axis directed from the light source to the first plane to be illuminated and an incident end surface of the one optical integrator to have an optically conjugated relation; and
         convert light from the focal point to light to be incident on the incident end surface of the one optical integrator at a second angle greater than the first angle with respect to the optical axis,
      wherein the one optical integrator reflects light incident from the incident end surface in an inside surface a plurality of times and emits light incident from the incident end surface, and
      wherein the first plane to be illuminated is illuminated with light from the one optical integrator.

16. A method of manufacturing an article, the method comprising the steps of:
   exposing a substrate using an exposure apparatus; and
   developing the substrate exposed in the exposing step,
   wherein the exposure apparatus is configured to transfer an image of a pattern formed on an original onto the substrate, and comprises:
      an illumination optical device; and
      a projection optical system configured to project a pattern of the original illuminated by the illumination optical device on the substrate,
      wherein the illumination optical device is configured to illuminate a first plane to be illuminated using light from a light source, and comprises:
         one optical integrator; and
         an imaging optical system configured to:
            cause a second plane including a focal point where a condensing mirror condenses light from the light source at a first angle with respect to an optical axis directed from the light source to the first plane to be illuminated and an incident end surface of the one optical integrator to have an optically conjugated relation; and
            convert light from the focal point to light to be incident on the incident end surface of the one optical integrator at a second angle greater than the first angle with respect to the optical axis,
         wherein the one optical integrator reflects light incident from the incident end surface in an inside surface a plurality of times and emits light incident from the incident end surface, and
         wherein the first plane to be illuminated is illuminated with light from the one optical integrator.

17. An illumination optical device for illuminating a first plane to be illuminated using light from a light source, the illumination optical device comprising:
   one optical integrator;
   a light forming unit configured to convert light from a focal point where a condensing mirror condenses light from the light source at a first angle with respect to an optical axis directed from the light source to the first plane to be illuminated to a light flux to be incident on an incident end surface of the one optical integrator at a second angle greater than the first angle with respect to the optical axis; and
   a wavelength filter blocking light in a specific wavelength range,
   wherein the wavelength filter is disposed between the focal point and the one optical integrator,
   wherein the one optical integrator reflects light incident from the incident end surface in an inside surface a plurality of times and emits light incident from the incident end surface, and
   wherein the first plane to be illuminated is illuminated with light from the one optical integrator.

18. The illumination optical device according to claim 17, wherein the wavelength filter is disposed at a position at which a beam effective diameter is greater than that of the incident end surface of the one optical integrator.

19. The illumination optical device according to claim 17, wherein:
   the light forming unit includes an optical system having a plurality of lenses, and
   the wavelength filter is disposed closer to the light source than a lens, among the plurality of lenses included in the optical system, closest to the one optical integrator in an optical path.

20. The illumination optical device according to claim 17, wherein:
the light forming unit includes an optical system having a plurality of lenses, and
the wavelength filter is disposed between the plurality of lenses included in the optical system.

21. The illumination optical device according to claim 17, wherein the light forming unit includes an imaging optical system configured to cause a second plane including the focal point and the incident end surface of the one optical integrator to have an optically conjugated relation.

22. The illumination optical device according to claim 21, wherein the wavelength filter is disposed at a pupil plane of the imaging optical system or a vicinity of the pupil plane.

23. The illumination optical device according to claim 17, wherein the light forming unit includes an condensing optical system configured to cause a surface including the focal point and the incident end surface of the one optical integrator to optically have a Fourier transform relation.

24. The illumination optical device according to claim 17, wherein the light forming unit includes a diffusion member configured to diffuse incident light.

25. The illumination optical device according to claim 24, wherein the diffusion member is a diffusion plate or a diffraction optical element.

26. The illumination optical device according to claim 24, wherein the wavelength filter is disposed closer to the light source than the diffusion member.

27. The illumination optical device according to claim 17, further comprising an imaging optical system configured to image light from the optical integrator on the first plane to be illuminated.

28. The illumination optical device according to claim 17, wherein the emission end surface of the optical integrator and the first plane to be illuminated are optically conjugated.

29. An exposure apparatus for transferring an image of a pattern form in an original onto a substrate, the exposure apparatus comprising:
the illumination optical device according to claim 17; and
a projection optical system configured to project a pattern of the original illuminated by the illumination optical device on the substrate,
wherein the illumination optical device illuminates a third plane to be illuminated of the original.

30. A method of manufacturing an article, the method comprising the steps of:
exposing a substrate using an exposure apparatus; and
developing the substrate exposed in the exposing step,
wherein the exposure apparatus is configured to transfer an image of a pattern formed on an original onto the substrate, and comprises:
an illumination optical device; and
a projection optical system configured to project a pattern of the original illuminated by the illumination optical device on the substrate,
wherein the illumination optical device is configured to illuminate a first plane to be illuminated using light from a light source, and comprises:
one optical integrator; and
a condensing optical system configured to cause a second plane including a focal point where a condensing mirror condenses light from the light source at a first angle with respect to an optical axis directed from the light source to the first plane to be illuminated and an incident end surface of the one optical integrator to optically have a Fourier transform relation,
wherein the condensing optical system converts light from the focal point to light to be incident on the incident end surface of the one optical integrator at a second angle greater than the first angle with respect to the optical axis, and
wherein the one optical integrator reflects light incident from the incident end surface in an inside surface a plurality of times and emits light incident from the incident end surface, and
wherein the first plane to be illuminated is illuminated with light from the one optical integrator.

31. A method for manufacturing an article, the method comprising the steps of:
exposing a substrate using an exposure apparatus; and
developing the substrate exposed in the exposing step,
wherein the exposure apparatus is configured to transfer an image of a pattern formed on an original onto the substrate, and comprises:
an illumination optical device;
a projection optical system configured to project a pattern of the original illuminated by the illumination optical device on the substrate,
wherein the illumination optical device is configured to illuminate a plane to be illuminated using light from a light source, and comprises:
one optical integrator;
a light forming unit configured to convert light from a focal point where a condensing mirror condenses light from the light source at a first angle with respect to an optical axis directed from the light source to the plane to be illuminated to a light flux to be incident on an incident end surface of the one optical integrator at a second angle greater than the first angle with respect to the optical axis; and
a wavelength filter blocking light in a specific wavelength range,
wherein the wavelength filter is disposed between the focal point and the one optical integrator, and
wherein the one optical integrator reflects light incident from the incident end surface in an inside surface a plurality of times and emits light incident from the incident end surface, and
wherein the plane to be illuminated is illuminated with light from the one optical integrator.

* * * * *